US007745281B2

(12) United States Patent
Prymak et al.

(10) Patent No.: US 7,745,281 B2
(45) Date of Patent: Jun. 29, 2010

(54) THIN SOLID ELECTROLYTIC CAPACITOR EMBEDDABLE IN A SUBSTRATE

(75) Inventors: John D. Prymak, Greer, SC (US); Chris Stolarski, Greenville, SC (US); David Jacobs, Greer, SC (US); Chris Wayne, Moore, SC (US); Philip Lessner, Newberry, SC (US); John T. Kinard, Greer, SC (US); Alethia Melody, Greenville, SC (US); Gregory Dunn, Arlington Heights, IL (US); Robert T. Croswell, Elgin, IL (US); Remy J. Chelini, Crystal Lake, IL (US)

(73) Assignees: Kemet Electronics Corporation, Greenville, SC (US); Motorola, Inc., Schaumburg, IL (US)

( * ) Notice: Subject to any disclaimer, the term of this patent is extended or adjusted under 35 U.S.C. 154(b) by 139 days.

(21) Appl. No.: 12/031,092

(22) Filed: Feb. 14, 2008

(65) Prior Publication Data

US 2008/0216296 A1    Sep. 11, 2008

Related U.S. Application Data

(60) Provisional application No. 60/905,553, filed on Mar. 7, 2007.

(51) Int. Cl.
H01L 21/8242 (2006.01)
(52) U.S. Cl. ........................ 438/244; 438/171; 438/210; 438/238; 438/239; 257/E27.024; 257/E51.003; 257/E51.025

(58) Field of Classification Search ................. 438/171, 438/190, 210, 238, 244, 142; 257/303, 306, 257/307, E27.024, E51.003, E51.025; 361/528, 361/532, 523; 29/25.03
See application file for complete search history.

(56) References Cited

U.S. PATENT DOCUMENTS

| 6,765,784 | B2 * | 7/2004 | Ohya et al. ................. 361/523 |
| 7,126,811 | B2 * | 10/2006 | Hirano et al. ............... 361/523 |
| 7,215,534 | B2 * | 5/2007 | Saito et al. ................. 361/528 |
| 2006/0120014 | A1 | 6/2006 | Nakamura et al. .......... 361/305 |
| 2007/0159771 | A1 | 7/2007 | Saito et al. ................. 361/528 |

FOREIGN PATENT DOCUMENTS

JP    2007123855    5/2007

* cited by examiner

*Primary Examiner*—Alexander G Ghyka
*Assistant Examiner*—Abdulfattah Mustapha
(74) *Attorney, Agent, or Firm*—Joseph T. Guy; Nexsen Pruet, LLC

(57) ABSTRACT

An improved method for forming a capacitor. The method includes the steps of: providing a metal foil; forming a dielectric on the metal foil; applying a non-conductive polymer dam on the dielectric to isolate discrete regions of the dielectric; forming a cathode in at least one discrete region of the discrete regions on the dielectric; and cutting the metal foil at the non-conductive polymer dam to isolate at least one capacitor comprising one cathode, one discrete region of the dielectric and a portion of the metal foil with the discrete region of the dielectric.

60 Claims, 5 Drawing Sheets

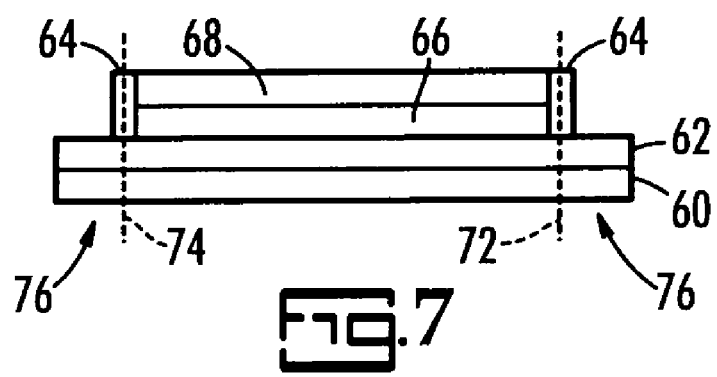
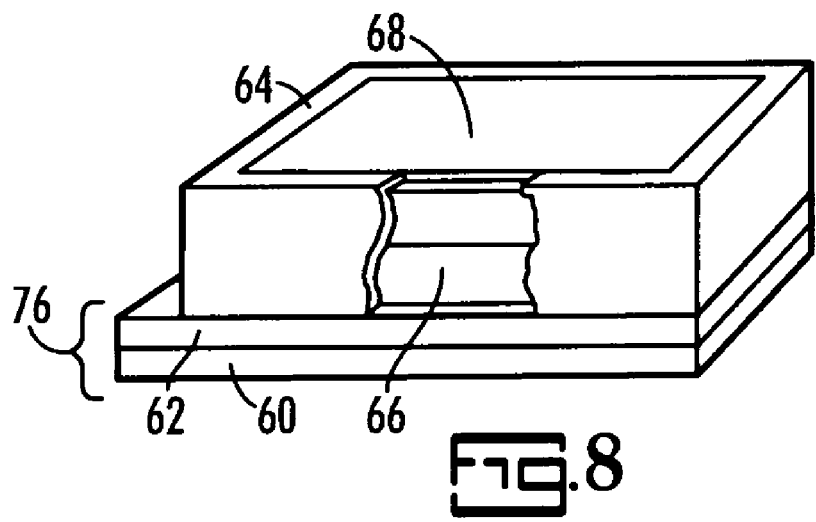
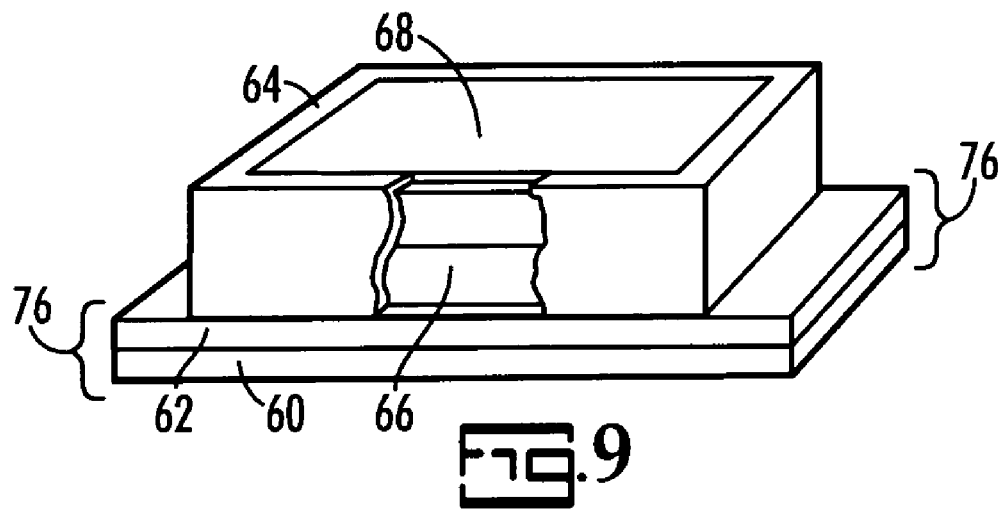

THIN SOLID ELECTROLYTIC CAPACITOR EMBEDDABLE IN A SUBSTRATE

CROSS-REFERENCE TO RELATED APPLICATIONS

The present invention claims priority to pending U.S. Provisional Application No. 60/905,553 filed Mar. 7, 2007.

BACKGROUND

The present invention is directed to thin solid electrolytic capacitors which are particularly suitable for embedding in a substrate and are surface mountable by conventional means. More particularly, the present invention is directed to a method of forming a thin solid electrolytic capacitor which is particularly suitable for embedding in a substrate and is surface mountable by conventional means.

Capacitors are utilized in virtually every electronic device. Their function in an electronic circuit is well known and further discussion is not warranted herein. The instant disclosure is directed to improvements in the manufacture of sheet based capacitors.

In one method of manufacture, capacitors are formed from metal sheets wherein the general process includes oxidation, or anodization, of a valve metal sheet to form a dielectric oxide, thus defining the anode (the valve metal substrate) and the dielectric of the finished device. A conductive layer is then formed on the dielectric, forming the initial cathode contact to the dielectric. The capacitor is conventionally utilized in an electrical circuit with the metal sheet functioning as the anode and the conductive layer functioning as the cathode even though this can be reversed to some degree.

Small surface mount capacitors have been successfully formed from metal foil and particularly aluminum foil. The foil, in either strip or sheet form, is typically etched to increase the surface area and then anodized to form a thin dielectric oxide on each face. A conductive layer, such as a conductive polymer, is then formed on the dielectric. If necessary, the strip is cut into rectangles. The rectangles may be combined in parallel to form a capacitor package. Terminal leads and molding are added to form a surface mountable capacitor.

The drive to reduce the size of electronic products, and in particular to make very thin electronic products, demands that capacitors become correspondingly thinner. There is a need for an ultra-thin, surface mountable capacitor package that is on the order of the thickness of a silicon chip which is typically less than 0.508 mm (0.020 inches) thick and preferably less than 0.254 mm (0.010 inches) thick, and/or an ultra-thin embeddable capacitor that can be embedded within a printed circuit board layer without increasing the board layer's thickness which is again less than about 0.508 mm (0.020 inches) thick and preferably less than 0.254 mm (0.010 inches) thick. The present invention provides a method for thin solid electrolytic capacitor formation.

SUMMARY

It is an object of the present invention to provide an improved method for manufacturing capacitors.

A particular feature of the present invention is the ability to mass produce a large number of capacitors as a single element followed by singulation.

A particular advantage is the ability to form capacitors which will be identical in composition formed as a batch followed by singulation into individual identical capacitors.

The capacitors formed by the method described herein can be utilized as surface mount capacitors or embedded within a substrate.

These and other advantages, as will be realized, are provided in a method for forming a capacitor. The method includes the steps of:
providing a metal foil;
forming a dielectric on the metal foil;
applying a patterned, non-conductive, preferably polymer, dam on the dielectric to isolate multiple discrete regions of the dielectric;
forming a cathode in at least one discrete region of the discrete regions on the dielectric contained within the dams created by the non-conductive dam; and
cutting the metal foil at the non-conductive dam to isolate at least one capacitor comprising one cathode, one discrete region of the dielectric, and a portion of the metal foil with the discrete region of the dielectric.

Yet another embodiment is provided in a method for forming a capacitor. The method includes the steps of:
providing a metal foil sheet with a dielectric on a surface thereof;
applying a patterned, non-conductive, preferably polymer, dam to the metal foil sheet, thereby forming multiple discrete regions of the metal foil sheet;
forming a cathode in at least one discrete region of the discrete regions contained within the dams, wherein the cathode is in contact with the dielectric and at least one cathode is separated from an adjacent cathode by the non-conductive dam; and
separating a discrete region of the discrete regions from the metal foil sheet, thereby forming a capacitor.

Yet another embodiment is provided in a method for forming an electrical device.

The method includes the steps of:
forming a capacitor by:
providing a metal foil sheet with a dielectric on a surface thereof;
applying a patterned, non-conductive dam to the metal foil sheet, thereby forming multiple, discrete regions of the metal foil sheet with a tab extending beyond each discrete region;
forming a cathode in at least one discrete region of the discrete regions contained within the dams created by the non-conductive polymer wherein the cathode is in contact with the dielectric and at least one cathode is separated from an adjacent cathode by the non-conductive polymer dam;
separating a discrete region of the discrete regions from the metal foil sheet; and forming an anode connector in electrical contact with the tab;
laminating the capacitor to a first substrate;
forming a second substrate over the capacitor opposite to the first substrate;
forming an anode trace and a cathode trace on said second substrate;
forming a first electrical connection between the anode connector and the anode trace; and
forming a second electrical connection between the cathode and the cathode trace.

BRIEF DESCRIPTION OF FIGURES

FIG. 7 is a schematic cross-sectional side view taken along line 7-7 of FIG. 6.

FIG. 8 is a schematic partial cut-away perspective view of a capacitor prepared by the present invention.

FIG. 9 is a schematic partial cut-away perspective view of a capacitor prepared by the present invention.

DETAILED DESCRIPTION

The invention will be described with reference to the various figures forming an integral non-limiting part of the disclosure. In the various figures, similar elements will be numbered accordingly. Throughout the various figures, layers are indicated schematically as rectangles. It is well known in the art that in practice the layers intermingle at the surface and the delineation between layers is more diffuse than illustrated schematically herein.

Figure 1:
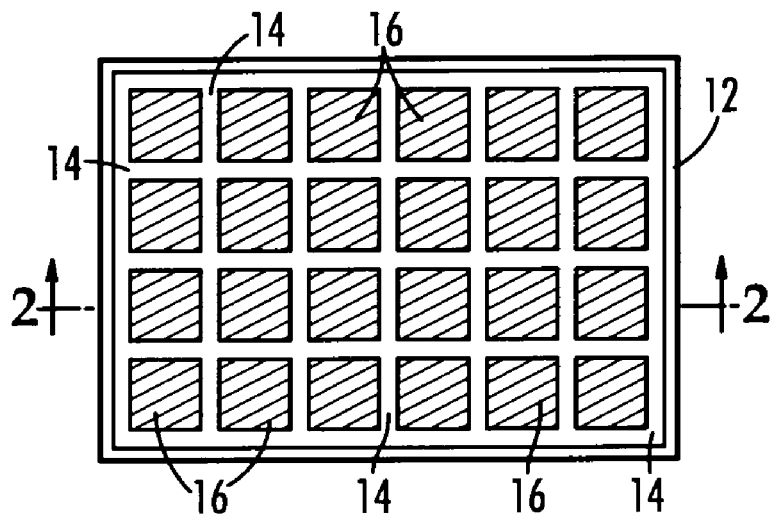
FIG. 1 is a schematic top view illustrating an embodiment of the present invention.
Figure 2:
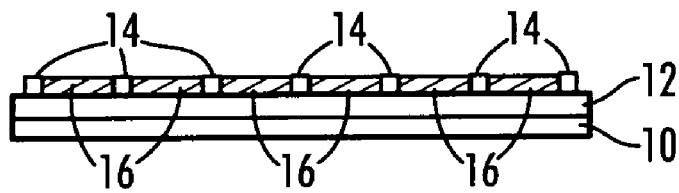
FIG. 2 is a schematic cross-sectional side view taken along line 2-2 of FIG. 1.

An embodiment of the invention is illustrated schematically in top view in FIG. 1 and in cross-sectional view in FIG. 2. In FIGS. 1 and 2, a metal foil, 10, forms the basis of the capacitor and will eventually become the anode. The foil is preferably roughened on at least one side by a standard method as known in the art. Electrochemical etching is particularly suitable and widely practiced in the art. The foil is cut into the appropriate size and shape depending on the particulars of the manufacturing environment but not otherwise limited herein.

The roughened foil is anodized to form a dielectric layer, 12, on at least one roughened surface thereof. In a particularly preferred embodiment, the dielectric layer is an anodic oxide of the valve metal. In an alternate embodiment, the dielectric is a ceramic material. The anodizing material is not particularly limited herein and any conventional anodizing solution is adequate for demonstrating the invention.

The dielectric layer is patterned by a non-conductive, preferably polymeric, material, 14, generally in such a manner as to create a grid pattern of exposed dielectric areas, 12, separated by the non-conductive regions, 14. The non-conductive material forms a dam isolating or surrounding discrete regions within which the finishing layers of the capacitor will be deposited and the dam defines the outermost boundaries of the cathode connection of the final device. The non-conductive dam may be applied by any method known in the art, with screen printing, wheel application, gravure printing, offset printing, positive displacement spray coating, masked spraying, ink jet printing, syringe dispensing, micropen printing, and the like being exemplary methods. A rectangular area is preferred due to volumetric efficiency, but the shape is not limited by the instant invention and may include irregular shapes that are less volumetrically efficient in absolute terms but may offer more effective use of available space within the other features of a printed circuit board. The width of the non-conductive dam is preferably just wider than the width of the kerf of the cutting operation plus any allowance necessary for cutting error. The cutting operation will be further discussed below.

A first cathode material, 16, is deposited on the dielectric within the regions formed by the non-conductive dam. The cathode preferably comprises a solid electrolyte layer formed from a material that possesses the capability to penetrate into the depths of the roughened surface of thin dielectric, 12, over the etched surface of the anode, 10. The solid electrolyte layer comprises a charge collection layer, preferably comprising at least one of a conductive polymer, a metallic layer, and a manganese dioxide layer.

Conductive polymers are preferably either intrinsically conducting polymers or polymers comprising a dopant material to impart conductivity, relegating these materials to be classified as semiconductive rather than conductive. The conductive polymer layer can be formed by in-situ chemical polymerization, carried out by selectively applying a monomer solution onto the dielectric into regions defined by the non-conductive polymer, followed by application of an oxidizer, or by first selectively applying the oxidizer solution followed by selective application of the monomer solution. More preferably, the polymer is formed by deposition of a suspension or slurry of polymer or polymer with manganese dioxide therein.

Manganese dioxide layers may be formed by selective application of a solution of a manganese salt, such as manganese nitrate or a permanganate compound, which is then converted to manganese dioxide by heating. Alternatively, the manganese dioxide can be selectively deposited as a suspension or slurry of manganese dioxide.

The cathode layer may comprise any combination of layers of conductive polymer and manganese dioxide layers. A single layer containing both manganese dioxide and one or more conductive polymers may be formed by selective application of a suspension or slurry containing manganese dioxide and one or more conductive polymers.

The solid electrolyte layer is typically not conducive to soldering or receiving a laser-drilled via and therefore additional layers are preferably applied to form the cathode. In one embodiment, the cathode is defined as those layers which are in electrical conductive contact with a solder layer. In another embodiment, the cathode is defined as those layers which are in electrical conductive contact with a via.

Figure 3:
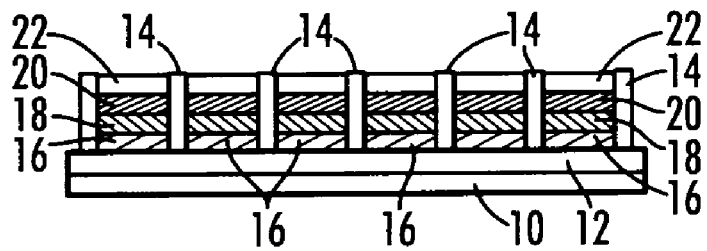
FIG. 3 is a schematic cross-sectional view illustrating an embodiment of the present invention.

Further treatments of the embodiment of FIGS. 1 and 2 are illustrated in schematic cross-section in FIG. 3. In FIG. 3, the metal foil, 10, dielectric layer, 12, non-conductive dam, 14, and solid electrolyte, 16, are as described relative to FIGS. 1 and 2. A carbon layer, 18, is preferably coated directly on the solid electrolyte, particularly when the solid electrolyte is a conductive polymer.

The carbon layer, 18, provides an interface between the solid electrolyte and subsequent cathode layers. In most applications, the solid electrolyte is poorly wet by conductive metal layers, thereby complicating efforts to form an electrical connection between the cathode and subsequent electrical circuitry. A carbon layer readily bonds to the solid electrolyte layer and is readily wet by subsequent layers with adequate adhesion and conductivity. It is preferable to limit the thickness of the carbon layer to that sufficient to form a conductive, adhered, junction between the solid electrolyte and subsequent layers. In an embodiment wherein the solid electrolyte is readily wet and good adherence can be achieved with subsequent layers, the carbon layer can be omitted. The carbon layer is preferably applied as a conductive carbon-based ink with a form of carbon in a carrier material. The carrier material preferably comprises a solvent and a binder wherein the solvent is removed, preferably by evaporation, leaving the conductive carbon in the binder. The binder and carbon content are not limited herein and would be chosen based on adhesion and conduction properties as necessary for the desired capacitor. Many conductive carbon-based ink compositions are commercially available and widely known in the art. The carbon is typically in the form of graphite, carbon black, carbon nanotubes, or combinations thereof.

A conductive metallic layer, 20, is applied over the carbon or solid electrolyte layer. The metallic layer allows for attachment of subsequent connective layers. The conductive metallic layer preferably comprises one or more layers of silver ink or paste, silver, copper ink or paste, copper, gold, palladium, or a combination thereof. The conductive metallic layer, when a silver ink or paste or copper ink or paste, is formed by selectively applying a conductive ink or paste onto the carbon or solid electrolyte layer. The conductive metallic layer, when silver, copper, gold, palladium, or other metal, is preferably applied with a thin layer deposition technique such as sputtering or an atomic layer deposition technique such as chemical vapor deposition (CVD) or physical vapor deposition (PVD) or with a spray technique such as plasma or flame spray, or by a plating technique such as electrolytic or electroless plating or a combination thereof. As with the carbon layer, it is desirable for the conductive metallic layer to be as thin as possible while still achieving adequate adhesion and sufficient coverage of the previous layer.

In some embodiments it is desirable to provide a surface mount land area, 22, on the cathode area. The surface mount land area is preferably formed by applying a solder coat onto the conductive metallic layer. The solder coating can be applied by dipping or reflowing solder, by application of a nickel barrier followed by solder plating, or by any other method as known in the art. The surface mount land area is preferable for surface mount devices but may be omitted if the device is intended for embedded applications. In addition to a solder coating, the surface mount land area may by covered with copper, gold, palladium or other metals having conductivity and/or oxidation resistance properties favorable to a specific application. The subsequent metal coating may be applied by a thin layer deposition technique, such as chemical vapor deposition (CVD) or physical vapor deposition (PVD), or with a spray technique, such as plasma or flame spray.

Figure 4:
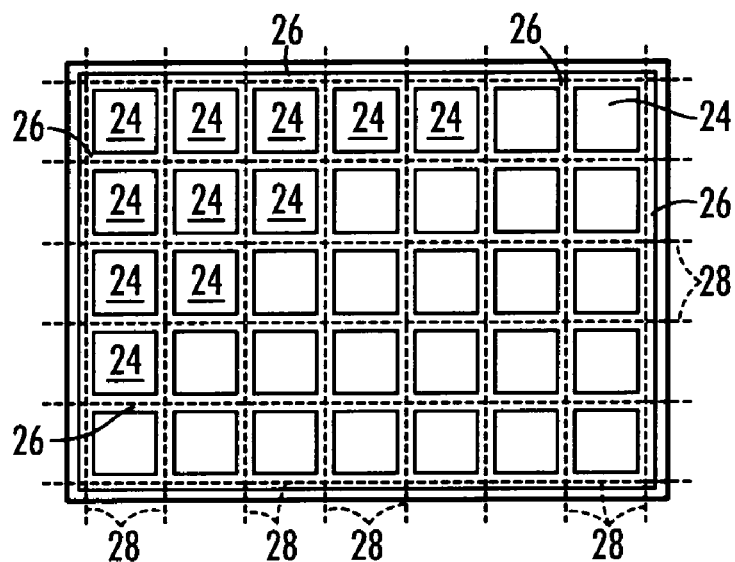
FIG. 4 is a schematic top view illustrating the cutting lines of the present invention.

After formation of the capacitive layers and subsequent layers for connection thereto, the individual capacitors are separated in a process referred to as singulation. This will be described with reference to FIG. 4 wherein illustrated in schematic top view is an unsingulated series of capacitors. Each capacitor, indicated at 24, comprises a discrete cathode separated from adjacent cathodes by non-conductive polymer, 26, and a common anode which is not visible in this view. To separate the individual capacitors a series of cuts is made along cutting lines, 28. Each cutting line is preferably within the boundaries of the non-conducting dam. It is preferred that the non-conductive dam be sufficiently wide to insure that the cathode area of each capacitor is bounded on all four sides by the non-conducting dam. Therefore, the dam is preferably slightly wider than the kerf of the cutting technique with sufficient width to account for any error in the cutting method utilized. The cutting method is not particularly limiting herein with the exception that it is preferable to utilize a method which is accurate and which has a minimal kerf and minimal error to minimize waste. Blade dicing, saw dicing, water jet, laser cutting, rotary cutting, shearing, die punching or other methods known in the art are exemplary. In one embodiment, multiple cathodes may remain together thereby forming a capacitor with discrete cathodes and a common anode.

Figure 5:
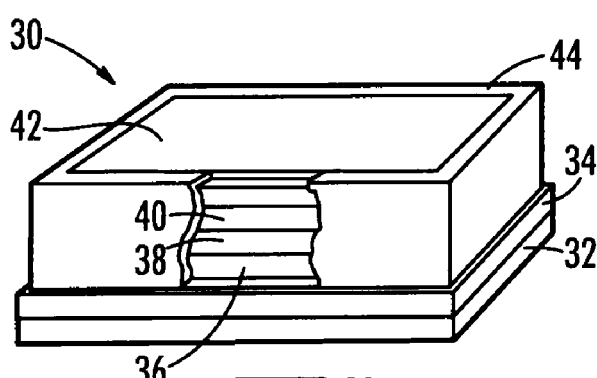
FIG. 5 is a schematic partial cut-away perspective view of a capacitor prepared by the present invention.

A schematic partial cutaway perspective view of an embodiment of a finished capacitor is illustrated in FIG. 5. In FIG. 5, the capacitor, generally represented at 30, comprises an anode, 32, forming one face of the capacitor. A dielectric, 34, is coated thereon. The cathodic portion of the capacitor comprises a conductor, 36, optional carbon layer, 38, metallic layer, 40, and optional metal layer, 42. The cathodic portion of the capacitor is preferably encased, in part, by a non-conductive material, 44, such as a polymer.

In another embodiment of the invention, the anode lead is a tab extending beyond the body of the capacitor.

Figure 6:
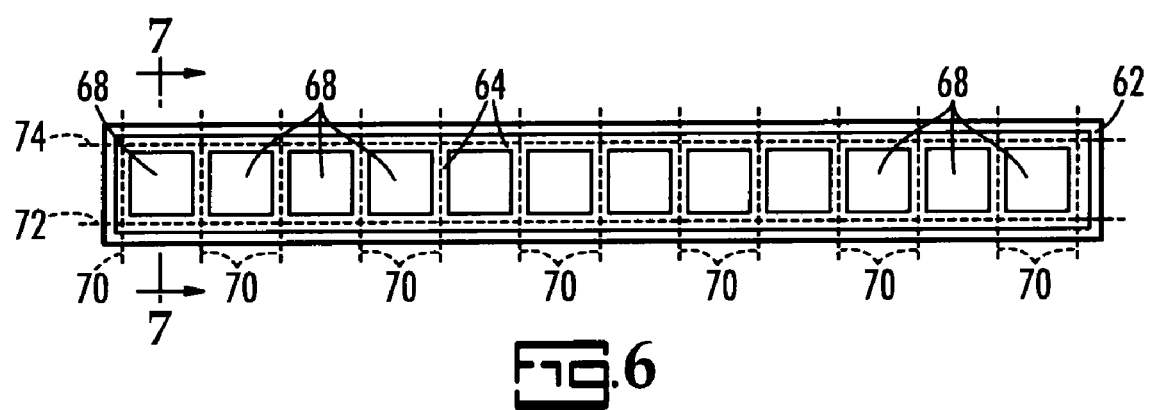
FIG. 6 is a schematic top view illustrating an embodiment of the present invention.

An embodiment of the invention is illustrated in schematic top view in FIG. 6 and schematic cross-sectional view in FIG. 7 taken along line 7-7 of FIG. 6. A valve metal, 60, preferably with a roughened surface, has a dielectric, 62, formed thereon. A non-conducting dam, 64, forms discrete regions on the dielectric. A solid electrolyte, 66, is formed within the regions formed on the dielectric by the non-conducting dam. An optional, but preferable mounting layer, 68, is coated on the solid electrolyte. The mounting layer is a layer sufficient to form an electrical connection to the cathode and may include a carbon layer and metal layers as necessary. In FIG. 6 the discrete capacitor areas are represented as forming a linear grid without limit thereto. The capacitors can be singulated to form individual capacitors without lead out tabs or with lead out tabs. In FIG. 6 primary cutting lines, 70, represent the cutting required to singulate the capacitors into individual capacitors. If a capacitor is desired with two lead out tabs, no further cutting is necessary. Secondary cutting lines, 72 and 74, can be used to form a capacitor with only one lead tab or no lead out tabs. A cut can be made on cutting line 72 but not 74, for example, to form a capacitor with only one lead out tab. The order of cutting is not particularly limited in any example herein.

FIG. 8 schematically illustrates a finished capacitor in partial cut-away perspective view with a single lead out anode tab. FIG. 9 schematically illustrates a finished capacitor in partial cut-away perspective view with two lead out anode tabs.

Another embodiment of the invention provides an anode lead wherein the anode and cathode are terminated in a common plane.

Figure 10:
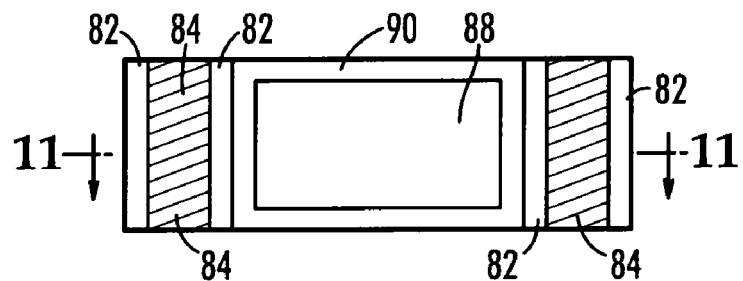
FIG. 10 is a schematic top view illustrating an embodiment of the present invention.
Figure 11:
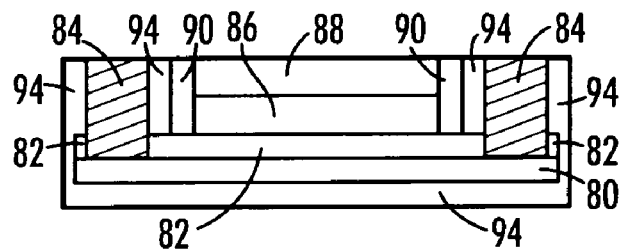
FIG. 11 is a cross-sectional side view taken along line 11-11 of FIG. 10.

An embodiment of the present invention is illustrated schematically in top view in FIG. 10 and cross-sectional side view in FIG. 11 taken along line 11-11 of FIG. 10. A metal, 80, preferably a valve metal or conductive oxide of a valve metal with a roughened surface, has a dielectric, 82, thereon. At least one anode connector, also referred to as an anode lead contact or anode contact, 84, in electrical contact with the valve metal, 80, extends away from the valve metal termination to a face which will be substantially coplanar with the upper surface of the cathode package comprising the solid electrolyte, 86, and optional mounting layer, 88. The cathode package is bounded by a non-conducting dam, 90. An optional overcoat, 94, can be applied over the anode, on the edges, and in any margin between the anode contact and non-conducting polymer to improve rigidity and to protect the capacitor. In one embodiment, it is preferable to add a series of anode contacts to a valve metal foil prior to singulating the capacitors. The anode contact can be a continuous element which is cut during the singulation process. In practice, the capacitor can be surface mounted, such as in a face down configuration, with the anode contact and cathode mounting layer secured to circuit traces by solder, conductive adhesive, or the like, or the capacitor can be embedded in a printed circuit board, such as in a face up configuration, with the anode contact and cathode mounting layer connected to circuit traces by vias, as will be described later. In either case, it is important that the anode contact and cathode mounting layer be coplanar. In the case of the surface mount capacitor, coplanarity of anode and cathode allows the capacitor to be reliably placed and soldered. In the embedded case, coplanarity of anode and cathode allows good quality laser vias to be drilled, with the same power and dwell time, to both surfaces. If the cathode and anode are not coplanar, one via may stop short of the surface, resulting in an open circuit, or one via may be over-drilled, resulting in excessive polymer ablation (barreling) and/or damage to the capacitor. For these purposes, coplanarity refers to the heights of the cathode and anode surfaces being within 0.0254 mm (0.001 inches), and preferably within 0.0127 mm (0.0005 inches), of each other.

Figure 12:
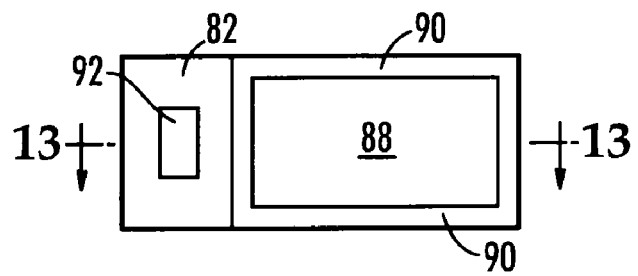
FIG. 12 is a schematic top view illustrating an embodiment of the present invention.
Figure 13:
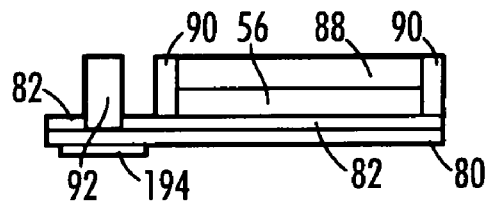
FIG. 13 is a cross-sectional side view taken along line 13-13 of FIG. 12.

Yet another embodiment is illustrated schematically in top view in FIG. 12 and in cross-sectional side view in FIG. 13 taken along line 13-13 of FIG. 12. The metal, 80, dielectric, 82, solid electrolyte 86, cathode mounting layer, 88, and dam 90 are as described with reference to FIGS. 10 and 11. The anode contact, 92, of FIGS. 12 and 13 does not extend the entire width of the anode tab, thereby forming an elevated island with dielectric there around. Furthermore, the anode contact penetrates the valve metal and may be secured on the opposite side thereof by a solder ball, 194, or the like. An overcoat (not shown) can be applied if desired.

The anode lead contact can be attached by welding or by forming a stud. In one embodiment, the anode lead contact is formed by welding a narrow strip of solid conductive material to the anode lead tab. Suitable materials for the anode lead contact include copper, copper alloys, or any conductive material capable of being resistance welded to the valve metal foil. The welding process can be designed such that the anode contact is coplanar with the cathode mounting layer without the need for lapping, grinding or other planing techniques. This process may take into account that the anode lead part may be compressed prior to or during welding. When pressing is utilized, the thickness of the anode at the anode lead is typically slightly less than that prior to pressing.

The anode lead contact may be formed by placing an anode lead stud of a conductive material through the anode lead tab such that the anode lead penetrates the valve metal foil. The anode lead tab is then preferably welded or soldered to insure adequate strength of the junction.

The anode lead contact may be in the non-conductive dam and this is preferred for increased volumetric efficiency. It would be apparent that the anode lead and cathode must be electrically isolated.

In some embodiments, it is preferred to overcoat portions of the finished capacitor. The overcoat layer increases rigidity of the finished device to minimize damage during end-of-line processing, packaging, or embedding, which can negatively affect DC leakage performance. The overcoat also acts as a protective barrier against moisture and contaminants to the valve metal foil.

The overcoat material may be a type of resin, glass-filled resin, silicone, or another insulative organic material. The overcoat material may be applied by screen printing, offset printing, gravure printing, spraying, dipping, molding, or other methods commonly employed for applying an overcoat to a capacitor. The overcoat layer may be applied prior to, or after, singulation and, in some cases, prior to patterning by the non-conductive polymer; however, when the anode connector is to be applied by welding, the overcoat must be applied after the attachment of the anode connector.

Figure 14:
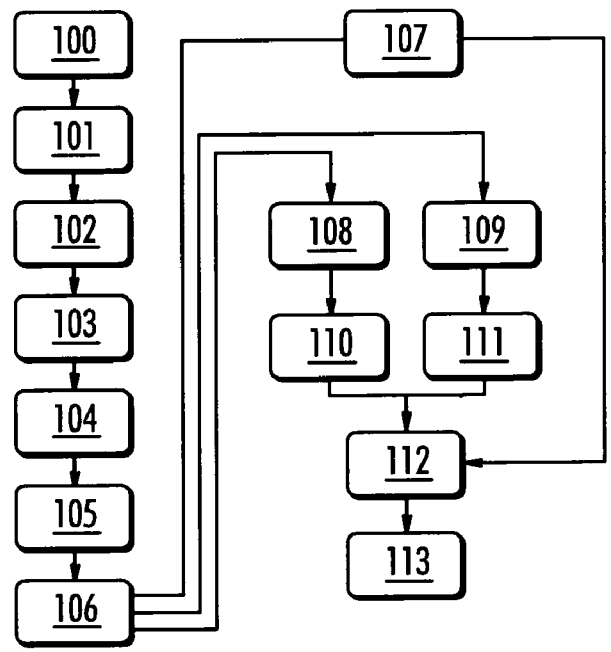
FIG. 14 is a flow chart representing the method of the present invention.

A process for forming the capacitors is illustrated in a flow chart in FIG. 14. In FIG. 14, the metal foil is prepared at 100. The preparation includes cutting the foil to the desired shape and size and preferably roughening the surface to increase the surface area of the foil. A dielectric is formed on the metal at 101. The dielectric can be an oxide of the metal, an oxide of a different metal, or a ceramic. The surface of the dielectric is patterned with a non-conducting polymer at 102. The pattern is preferably a grid with cathode regions therein. A solid electrolyte layer is formed on the dielectric in the cathode regions at 103. An optional, but preferred carbon layer is applied on the solid electrolyte layer at 104. The carbon layer provides conduction and adhesion to a conductive metallic layer formed thereon at 105. An optional solder coating is applied at 106. If no anode lead contacts are to be formed, the capacitors are singulated by cutting at 107 and then optionally, but preferably, overcoated at 112. If anode lead contacts are to be utilized, the capacitors can be singulated at 108, followed by forming the anode lead contact at 110. Alternatively, the anode lead contacts can be formed at 109 followed by singulation at 111. In either case, it is preferable to overcoat the capacitor at 112 prior to use at 113.

The foil forming the anode is preferably a conductive foil preferably comprising a valve metal or a conductive oxide of a valve metal wherein the valve metal is selected from aluminum, tantalum, titanium, niobium, zirconium, hafnium, or a combination thereof. In one embodiment, the foil consists essentially of a metal foil selected from the group consisting of aluminum, tantalum, titanium, niobium, zirconium, and hafnium. The foil may be a formed metallic sheet or a powder pressed into a sheet. Most preferably, the foil is a formed metallic aluminum foil.

A capacitor formed by the method described herein may be a surface-mountable device, wherein the capacitor is mounted to circuit traces of a substrate as commonly employed with capacitors. The capacitor may also be embedded in a circuit substrate and electrically connected using either blind or through vias. The capacitor would be laminated between layers of a substrate. The vias would either be formed prior to lamination of subsequent layers or after lamination.

Figure 15:
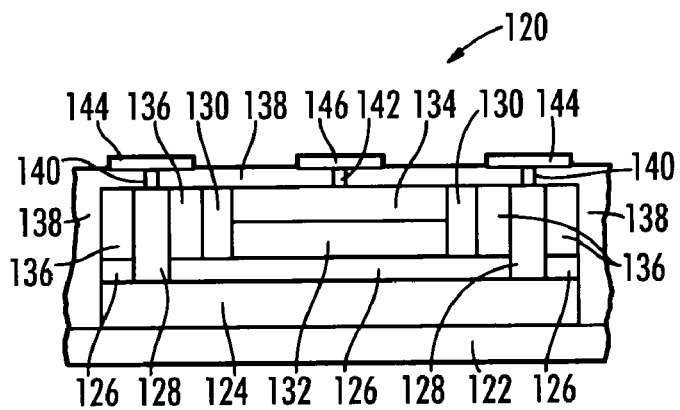
FIG. 15 is a schematic cross-sectional view illustrating an embodiment of the present invention.

An embodiment of the invention is illustrated in FIG. 15. In FIG. 15, an electronic device is generally illustrated at 120. The electronic device comprises a substrate, 122. Laminated to the substrate is an anode, 124, of the capacitor. The anode can be laminated with an adhesive. An overcoat may be between the anode and substrate; however, a capacitor prepared for this application may not have an overcoat since the cost is not warranted. A dielectric, 126, is coated on the anode as described herein. An anode lead contact, 128, is in electrical contact with the anode, thereby forming an anodic contact on the same face as the cathode contact. A non-conductive polymeric dam, 130, defines the edge of the cathode, 132, and cathode mounting layer, 134. The cathode mounting layer preferably comprises a metal layer and optionally comprises a carbon layer. An overcoat, 136, provides protection for the elements of the capacitor. A laminate, 138, encases the capacitor, thereby forming an embedded capacitor. An anode via, 140, passing through the laminate, forms an electrical connection between the anode lead contact, 128, and an anode trace, 144, on laminate, 138. A cathode via, 142, forms an electrical connection between the cathode, 132, and cathode trace, 146. The via is a void in the laminate filled with, or coated with, conductive material as is well known in the art.

Figure 16:
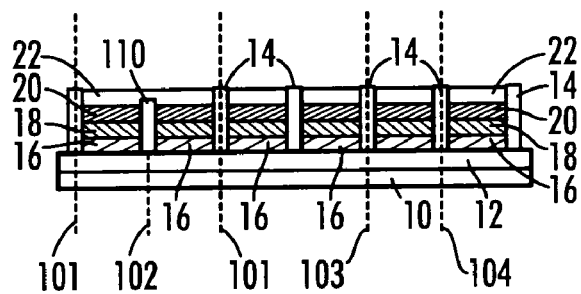
FIG. 16 is a schematic cross-sectional view illustrating an embodiment of the present invention.

An embodiment of the invention is illustrated schematically in FIG. 16 wherein the formation of various types of capacitors can be described. In FIG. 16, the metal foil, 10, dielectric, 12, non-conductive material, 14, solid electrolyte, 16, carbon layer, 18 and conductive metallic layer, 20, are as described above. At least one non-conductive material, 110, allows at least a portion of adjacent cathode layers to be in electrical contact. By allowing such contact through cuts can be made at 101 with a partial cut made at 102 of sufficient depth to form a kerf in the anode. This forms a capacitor with a common cathode and discrete anodes. By making through cuts at 101 and 103 a capacitor can be made with discrete cathodes and a common anode. By making through cuts at 103 and 104 a cathode with a single anode and single cathode can be formed.

The invention has been described with particular reference to the preferred embodiments without limit thereto. One of skill in the art would realize additional embodiments which are not specifically recited but within the scope of the claims appended hereto.

claimed is:

1. A method for forming a capacitor comprising:
providing a conductive foil;
forming a dielectric on said conductive foil;
applying a non-conductive dam on said dielectric to isolate discrete regions of said dielectric;
forming a cathode in at least one discrete region of said discrete regions on said dielectric; and
cutting at said non-conductive dam to isolate at least one capacitor comprising at least one said cathode, at least one said discrete region of said dielectric and a portion of said conductive foil comprising said at least one discrete region of said dielectric.

2. The method for forming a capacitor of claim 1 wherein said non-conductive dam comprises a polymer.

3. The method for forming a capacitor of claim 1 further comprising applying a carbon layer to said cathode.

4. The method for forming a capacitor of claim 3 further comprising applying a metal layer to said carbon layer.

5. The method for forming a capacitor of claim 1 further comprising applying a metal layer to said cathode layer.

6. The method for forming a capacitor of claim 1 wherein conductive foil comprises a metal.

7. The method for forming a capacitor of claim 1 wherein said conductive foil comprises a valve metal or a conductive oxide of a valve metal.

8. The method for forming a capacitor of claim 7 wherein said valve metal is selected from the group consisting of aluminum, tantalum, titanium, niobium, zirconium, and hafnium.

9. The method for forming a capacitor of claim 1 wherein said cathode comprises a solid electrolyte layer.

10. The method for forming a capacitor of claim 9 wherein said solid electrolyte layer comprises at least one material selected from the group consisting of a metal, a conductive polymer and manganese dioxide.

11. The method for forming a capacitor of claim 10 wherein said conductive polymer is an intrinsically conducting polymer.

12. The method for forming a capacitor of claim 1 wherein said non-conductive dam surrounds at least one of said discrete regions.

13. The method for forming a capacitor of claim 1 wherein said conductive foil further comprises at least one tab extending beyond said discrete region.

14. The method for forming a capacitor of claim 1 wherein said cutting comprises a method selected from the group consisting of blade dicing, saw dicing, water jet, laser cutting, rotary cutting, shearing and die punching.

15. A method for forming a capacitor comprising:
providing a conductive foil with a dielectric on a surface thereof;
applying a non-conductive dam to said conductive foil sheet thereby forming discrete regions of said conductive foil;
forming a cathode in at least two discrete regions of said discrete regions wherein said cathode is in contact with said dielectric and at least one cathode is separated from at least one other cathode by said non-conductive dam;
separating a discrete region of said conductive foil thereby forming a capacitor.

16. The method for forming a capacitor of claim 15 wherein said non-conductive dam comprises a polymer.

17. The method for forming a capacitor of claim 15 wherein said non-conductive dam surrounds at least one discrete region of said discrete regions.

18. The method for forming a capacitor of claim 15 further comprising applying a carbon layer to said cathode.

19. The method for forming a capacitor of claim 18 further comprising applying a metal layer to said carbon layer.

20. The method for forming a capacitor of claim 15 further comprising applying a metal layer to said cathode layer.

21. The method for forming a capacitor of claim 15 wherein conductive foil comprises a metal or a conductive metal oxide.

22. The method for forming a capacitor of claim 15 wherein said conductive foil comprises a valve metal or a conductive oxide of a valve metal.

23. The method for forming a capacitor of claim 22 wherein said valve metal is selected from the group consisting of aluminum, tantalum, titanium, niobium, zirconium, and hafnium.

24. The method for forming a capacitor of claim 15 wherein said cathode is a solid electrolyte layer.

25. The method for forming a capacitor of claim 24 wherein said solid electrolyte layer comprises at least one material selected from the group consisting of a metal, a conductive polymer and manganese dioxide.

26. The method for forming a capacitor of claim 25 wherein said conductive polymer is an intrinsically conducting polymer.

27. The method for forming a capacitor of claim 15 wherein said metal foil further comprises at least one tab extending beyond said discrete region.

28. The method for forming a capacitor of claim 15 wherein said cutting comprises a method selected from the group consisting of blade dicing, saw dicing, water jet, laser cutting, rotary cutting, shearing and die punching.

29. The method for forming a capacitor of claim 1 further comprising forming at least one anode connector in electrical contact with said conductive foil.

30. The method for forming a capacitor of claim 29 wherein said cathode comprises a mounting layer and said anode connector comprises a surface which is coplanar with a surface of said mounting layer.

31. The method for forming a capacitor of claim 13 further comprising forming an anode connector in electrical contact with said tab.

32. The method for forming a capacitor of claim 1 further comprising:
   laminating said capacitor to a first substrate;
   forming a second substrate over said capacitor opposite to said first substrate;
   forming an anode trace and a cathode trace;
   forming a first electrical connection between said anode connector and said anode trace; and
   forming a second electrical connection between said cathode and said cathode trace.

33. The method for forming a capacitor of claim 32 wherein said first electrical connection is a via.

34. The method for forming a capacitor of claim 32 wherein said second electrical connection is a via.

35. The method for forming a capacitor of claim 1 wherein said cutting at said non-conductive dam isolates at least one capacitor comprising at least two cathodes.

36. The method for forming a capacitor of claim 35 wherein said capacitor comprising at least two cathodes has a single anode.

37. The method for forming a capacitor of claim 1 wherein said cutting at said non-conductive dam isolates at least one capacitor comprising one cathode and two.

38. The method for forming a capacitor of claim 1 further comprising forming an anode connector in electrical contact with said conductive foil.

39. The method for forming a capacitor of claim 38 wherein said cathode comprises a mounting layer and said anode connector comprises a surface which is coplanar with a surface of said mounting layer.

40. The method for forming a capacitor of claim 39 further comprising forming an anode connector in electrical contact with said tab.

41. The method for forming a capacitor of claim 40 further comprising:
   laminating said capacitor to a first substrate;
   forming a second substrate over said capacitor opposite to said first substrate;
   forming an anode trace and a cathode trace;
   forming a first electrical connection between said anode connector and said anode trace; and
   forming a second electrical connection between said cathode and said cathode trace.

42. The method for forming a capacitor of claim 41 wherein said first electrical connection is a via.

43. The method for forming a capacitor of claim 41 wherein said second electrical connection is a via.

44. The method for forming a capacitor of claim 15 wherein said cutting at said non-conductive polymer dam isolates at least one capacitor comprising at least two cathodes.

45. The method for forming a capacitor of claim 44 wherein said capacitor comprising at least two cathodes has a single anode.

46. The method for forming a capacitor of claim 15 wherein said cutting at said non-conductive dam isolates at least one capacitor comprising one cathode and two anodes.

47. A method for forming an electrical device comprising:
   forming a capacitor by:
      providing a conductive foil with a dielectric on a surface thereof;
      applying a non-conductive dam to said conductive foil thereby forming discrete regions of said conductive foil with a tab extending beyond at least one of said discrete regions;
      forming a cathode in at least one discrete region of said discrete regions wherein said cathode is in contact with said dielectric and at least one cathode is separated from at least one other cathode by said non-conductive dam;
      separating a discrete region of said conductive foil; and
      forming an anode connector in electrical contact with said tab;
   laminating said capacitor to a first substrate;
   forming a second substrate over said capacitor opposite to said first substrate;
   forming an anode trace and a cathode trace;
   forming a first electrical connection between said anode connector and said anode trace; and
   forming a second electrical connection between said cathode and said cathode trace.

48. The method for forming an electrical device of claim 47 wherein said non-conductive dam comprises a polymer.

49. The method for forming an electrical device of claim 47 further comprising applying a metal layer to said cathode layer.

50. The method for forming a capacitor of claim 47 wherein conductive foil comprises a metal or a conductive metal oxide.

51. The method for forming a capacitor of claim 47 wherein said conductive foil comprises a valve metal or a conductive oxide of a valve metal.

52. The method for forming a capacitor of claim 51 wherein said valve metal is selected from the group consisting of aluminum, tantalum, titanium, niobium, zirconium, and hafnium.

53. The method for forming an electrical device of claim 47 wherein said cathode is a solid electrolyte layer.

54. The method for forming an electrical device of claim 53 wherein said solid electrolyte layer comprises at least one material selected from the group consisting of a metal, a conductive polymer and manganese dioxide.

55. The method for forming an electrical device of claim 54 wherein said conductive polymer is an intrinsically conducting polymer.

56. The method for forming an electrical device of claim 47 wherein said first electrical connection is a via.

57. The method for forming an electrical device of claim 47 wherein said second electrical connection is a via.

58. The method for forming a capacitor of claim 47 wherein said cutting at said non-conductive dam isolates at least one capacitor comprising at least two cathodes.

59. The method for forming a capacitor of claim 58 wherein said capacitor comprising at least two cathodes has a single anode.

60. The method for forming a capacitor of claim 47 wherein said cutting at said non-conductive dam isolates at least one capacitor comprising one cathode and two anodes.

* * * * *

UNITED STATES PATENT AND TRADEMARK OFFICE
CERTIFICATE OF CORRECTION

| | | |
|---|---|---|
| PATENT NO. | : 7,745,281 B2 | Page 1 of 1 |
| APPLICATION NO. | : 12/031092 | |
| DATED | : June 29, 2010 | |
| INVENTOR(S) | : Prymak et al. | |

It is certified that error appears in the above-identified patent and that said Letters Patent is hereby corrected as shown below:

In Column 11, Line 24, in Claim 38, delete "claim 1" and insert -- claim 15 --, therefor.

Signed and Sealed this
Fourteenth Day of August, 2012

David J. Kappos
*Director of the United States Patent and Trademark Office*